United States Patent
Eleyan et al.

(10) Patent No.: US 7,036,098 B2
(45) Date of Patent: Apr. 25, 2006

(54) ON-CHIP SIGNAL STATE DURATION MEASUREMENT AND ADJUSTMENT

(75) Inventors: Nadeem N. Eleyan, Austin, TX (US); Harsh D. Sharma, Austin, TX (US); Howard L. Levy, Cedar Park, TX (US); Hong S. Kim, Austin, TX (US)

(73) Assignee: Sun Microsystems, Inc., Palo Alto, CA (US)

( * ) Notice: Subject to any disclaimer, the term of this patent is extended or adjusted under 35 U.S.C. 154(b) by 204 days.

(21) Appl. No.: 10/610,252

(22) Filed: Jun. 30, 2003

(65) Prior Publication Data
US 2004/0268280 A1  Dec. 30, 2004

(51) Int. Cl.
*G06F 17/50* (2006.01)
(52) U.S. Cl. ............................ 716/4; 716/5; 716/6
(58) Field of Classification Search ................ 716/1, 716/4–6; 714/30, 715, 733–734
See application file for complete search history.

(56) References Cited

U.S. PATENT DOCUMENTS

| | | | |
|---|---|---|---|
| 5,923,195 A | 7/1999 | Graf, III | 327/144 |
| 6,219,305 B1 | 4/2001 | Patrie et al. | 368/113 |
| 6,326,827 B1 * | 12/2001 | Cretti et al. | 327/175 |
| 6,442,722 B1 | 8/2002 | Nadeau-Dostie et al. | 714/731 |
| 6,518,809 B1 * | 2/2003 | Kotra | 327/175 |
| 6,912,681 B1 | 6/2005 | Schoeber | 714/738 |
| 2004/0041609 A1 * | 3/2004 | Lin | 327/175 |
| 2004/0075462 A1 * | 4/2004 | Kizer et al. | 326/29 |
| 2004/0268280 A1 | 12/2004 | Eleyan et al. | 716/6 |

* cited by examiner

*Primary Examiner*—Paul Dinh
(74) *Attorney, Agent, or Firm*—Hamilton & Terrile, LLP; Kent B. Chambers (57) ABSTRACT

Signal state durations, such as the pulse-width, of on-chip signals are often critical to the successful operation of an integrated circuit. The signal state durations measured by on-chip technology provide signal state duration information to an on-chip signal state duration control system. The signal state duration control system uses the information to adjust the signal state duration of an on-chip signal. In one embodiment, the signal state duration of the on-chip signal is the pulse width of the on-chip signal. The signal duration measurement and adjustment system is, for example, useful for measuring the state duration of signals such as self-resetting signals, which are difficult to externally measure and adjust signal state durations using on-chip technology.

27 Claims, 12 Drawing Sheets

ON-CHIP SIGNAL STATE DURATION MEASUREMENT AND ADJUSTMENT

BACKGROUND OF THE INVENTION

1. Field of the Invention

The present invention relates in general to the field of integrated circuits, and more specifically to a system and method for adjusting the pulse-width of an on-chip signal using an on-chip system.

2. Description of the Related Art

Integrated circuits typically utilize many on-chip timing and control signals. Signals have states. For example, a binary signal has high and low states, which are often referred to as "1" and "0," respectively. Many integrated circuit designs depend on a proper duration of a signal's state for accurate performance. For example, in a flip-flop based integrated circuit design, it is typically critical to ensure that a coupled clock frequency is stable at an optimum required clock cycle to allow enough time for critical paths to fully evaluate before the next clock cycle. If the clock frequency increases, the longest path may not be able to fully evaluate before the next clock cycle and the circuit would not function as desired. In another example, in some integrated circuit designs, a circuit is supposed to evaluate in one half-clock cycle instead of a full clock cycle.

Other circuits, such as self-resetting circuits, have particular timing issues. For example, in self-resetting circuits, a pulse width of a reset signal, generated by the circuit itself, determines the evaluation period. Such designs are typically very sensitive to process variations. Also, unlike clock-based designs, where the circuit may fail at some frequency but function properly if the clock frequency decreases, once a self timed circuit fails, it fails at any clock frequency. This is because the pulse width of the self-reset signal is hard coded in the circuit and is not controlled by an external clock. Some technologies are particularly susceptible to having and even developing timing problems over a period of time. For example, in some small-scale device technologies, "Negative Bias Temperature Instability" (NBTI) can cause the voltage threshold of P-channel metal oxide semiconductor (PMOS) devices to increase by a certain voltage level depending on the historical amount of voltage bias present between the gate and source/drain nodes of the PMOS device. A sufficient increase in voltage thresholds can generate the self reset signal and cause variations in the pulse width of the self reset signal, which results in a hard failure at all clock frequencies.

Detecting a circuit failure caused by timing in a circuit, such as a self-resetting circuit, is very difficult using conventional technology. The pulse-width of a signal reflects the duration of a signal's state. Timing errors often involve on-chip signal pulse widths whose durations are either too long or too short. However, once a timing problem is discovered, adjusting the pulse width of a signal is conventionally difficult especially for chips that have been distributed to customers.

SUMMARY OF THE INVENTION

In one embodiment of the present invention, a method of adjusting a signal state duration of an on-chip signal using one or more on-chip systems includes determining the signal state duration of the on-chip signal within a range of accuracy using on-chip circuitry and comparing the signal state duration to a desired value using a first on-chip system. If the determined signal state duration of the on-chip signal does not have a desired value, adjust the signal state duration towards the desired value using a second on-chip system.

In another embodiment of the present invention, an apparatus having one or more on-chip systems to determine and adjust a signal state duration of one or more on-chip signals includes an on-chip signal state duration measuring system having an input to receive an on-chip signal and determine the signal state duration of the on-chip signal within a range of accuracy. The apparatus further includes an on-chip signal state duration control system coupled to the signal state duration measuring system to receive the determined signal state duration of the on-chip signal and, if the signal state duration of the on-chip signal is not within a predetermined tolerance, to adjust the signal state duration of the on-chip signal to a desired value.

In another embodiment of the present invention, an integrated circuit having a system to adjust a signal state duration of an on-chip signal using one or more on-chip systems, includes on-chip means to determine the signal state duration of the on-chip signal within a range of accuracy and means, coupled to the means to determine, to compare the signal state duration to a desired value using a first on-chip system. The integrated circuit further includes means to adjust the signal state duration towards the desired value using a second on-chip system if the determined signal state duration of the on-chip signal does not have a desired value.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Although the present invention has been described in detail, it should be understood that various changes, substitutions and alterations can be made hereto without departing from the spirit and scope of the invention as defined by the appended claims.

Signal state durations, such as the pulse-width, of on-chip signals are often critical to the successful operation of an integrated circuit. Commonly assigned patent application Ser. No. 10/292329 entitled "On-Chip Measurement of Signal State Duration", inventors Nadeem N. Eleyan, Harsh D. Sharma, Howard L. Levy, and Hong S. Kim, which is hereby incorporated by reference in its entirety, describes examples of a signal state duration measurement system technology that measures signal state durations using on-chip technology. The signal state durations measured by on-chip technology provide signal state duration information to an on-chip signal state duration control system. The signal state duration control system uses the information to adjust the signal state duration of an on-chip signal. In one embodiment, the signal state duration of the on-chip signal is the pulse width of the on-chip signal.

Figure 1:
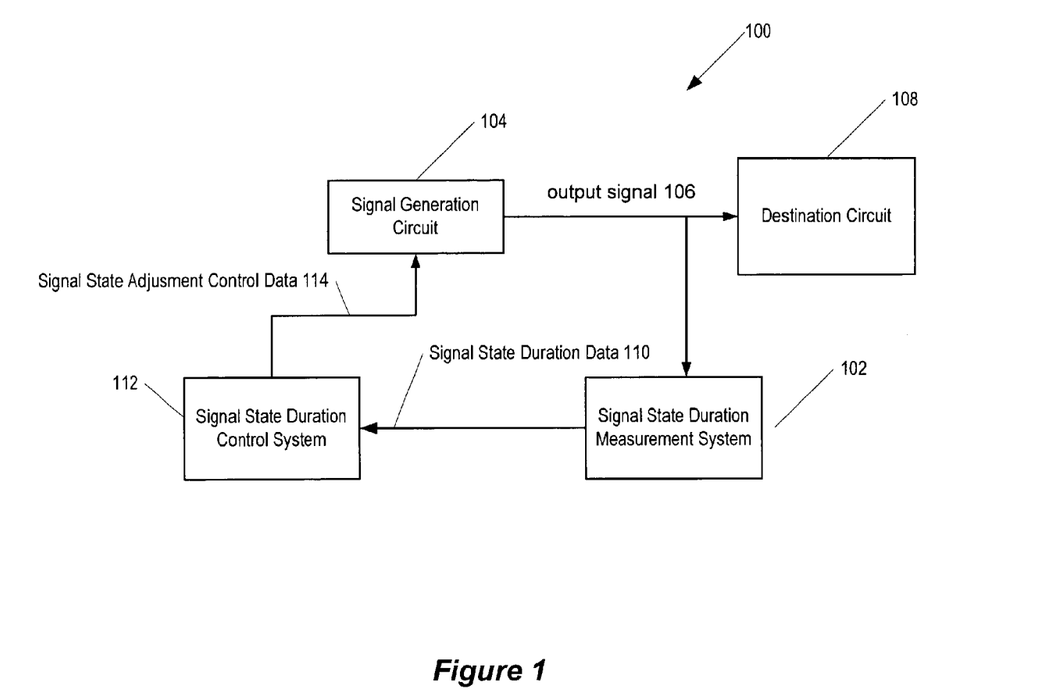
FIG. 1 depicts an on-chip signal duration and measuring control system.

FIG. 1 depicts an on-chip signal duration and measuring control system 100. The control system 100 includes an on-chip signal state duration measurement system 102 that detects the signal state duration of an output signal 106 of the signal generation circuit 104.

The signal state duration measurement system 102 provides signal state duration data 110 to a signal state duration control system 112. The signal state duration measurement system 102 and signal state duration control system 112 are preferably both on-chip systems so that the process of measuring and adjusting signal state durations can occur with minimal, if any, off-chip circuitry, probes, or other off-chip access and processing mechanisms. Thus, chips can be, for example, auto correcting without the need of test equipment or other laboratory equipment. The auto correction can be programmed to occur continuously or at various predetermined time intervals. The signal state duration standards can also be preprogrammed as a constant or determined via a programmed algorithm.

The signal state duration control system 112 compares the signal state duration data 110 with a desired value using, for example, well-known digital logic or using software and an on-board processor. If the signal state duration data 110 is outside of a predetermined tolerance, signal state duration control system 112 adjusts the signal state duration of output signal 106 by sending signal state adjustment control data 114. As described in more detail below, one method of adjusting the signal state duration of output signal 106 involves adjusting the turn-on and/or turn-off strength of sourcing and sinking signal drive transistors of the signal generation circuit 104.

Figure 2:
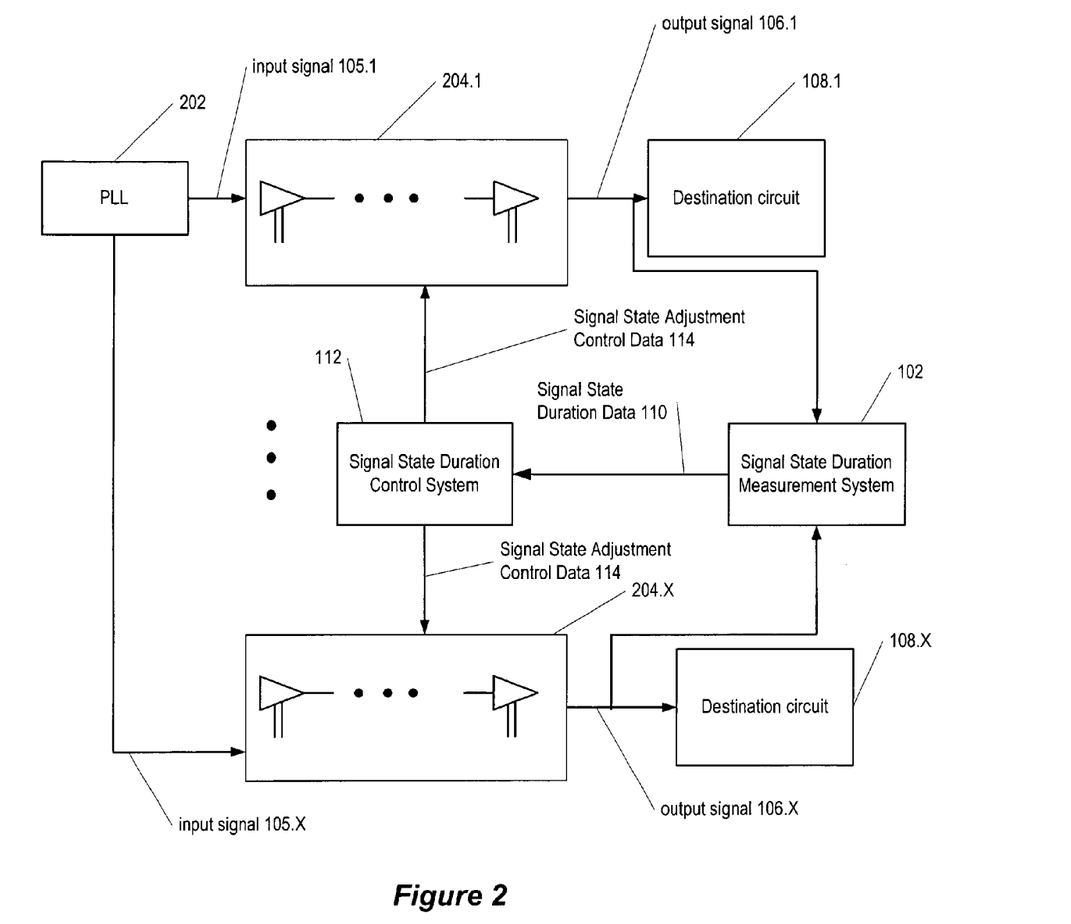
FIG. 2 depicts an embodiment of the on-chip signal duration and measuring control system of FIG. 1.

FIG. 2 depicts signal state control system 200, which represents one embodiment of control system 100. The phase lock loop (PLL) 202 generates an output signal. Adjustable control strength signal drive stages 204.1 through 204.X provide the output signal 106 to respective destination circuits 108.1 through 108.X. Each of signal drive/state duration control stages 204 have controllable turn-on and/or turn-off strength of sourcing and sinking signal drive transistors, which can be used to intentionally skew the rise and/or fall times of one or more drive stages in each of signal drive stages 204. This skewing of rise and/or fall times is used to increase or decrease the signal state duration of output signal 106 by respectively increasing or decreasing the pulse width of output signal 106. The signal state duration measurement system 102 and signal state duration control system 112 can measure signal state duration of any number of output signals and provide signal state adjustment control data 114.1 through 114.X for controlling the signal state duration of drive stages 204.1 through 204.X, respectively. Signal state duration tolerance data for signal state duration measurement system 102 and signal generation circuit 104 can be customized to the particular output signal being sampled.

In one embodiment, signal drivers, fabricated using a complimentary metal oxide semiconductor (CMOS) process, use one or more P-channel metal oxide semiconductor field effect transistors (MOSFET) and N-channel metal oxide semiconductor field effect transistors (MOSFET) configured as inverters to drive input signal 105 and generate output signal 106. In one embodiment, the one or more P-channel MOSFETs are configured as pull-up transistors, and the one or more N-channel MOSFETs are configured as pull-down transistors. The signal state duration of output signal 106 can thus be adjusted by adjusting the pull-up and/or pull-down 'strength' (referred to as the "P/N strength") of the signal drivers. Adjusting the pull-up and/or pull-down strength of the signal drivers adjusts the respective rising and falling edge time delays of the signal being driven. Adjusting the rising and/or falling edge time delays adjusts the pulse width of the driven signal, which in one embodiment represents the signal state duration of the driven signal.

Figure 3:
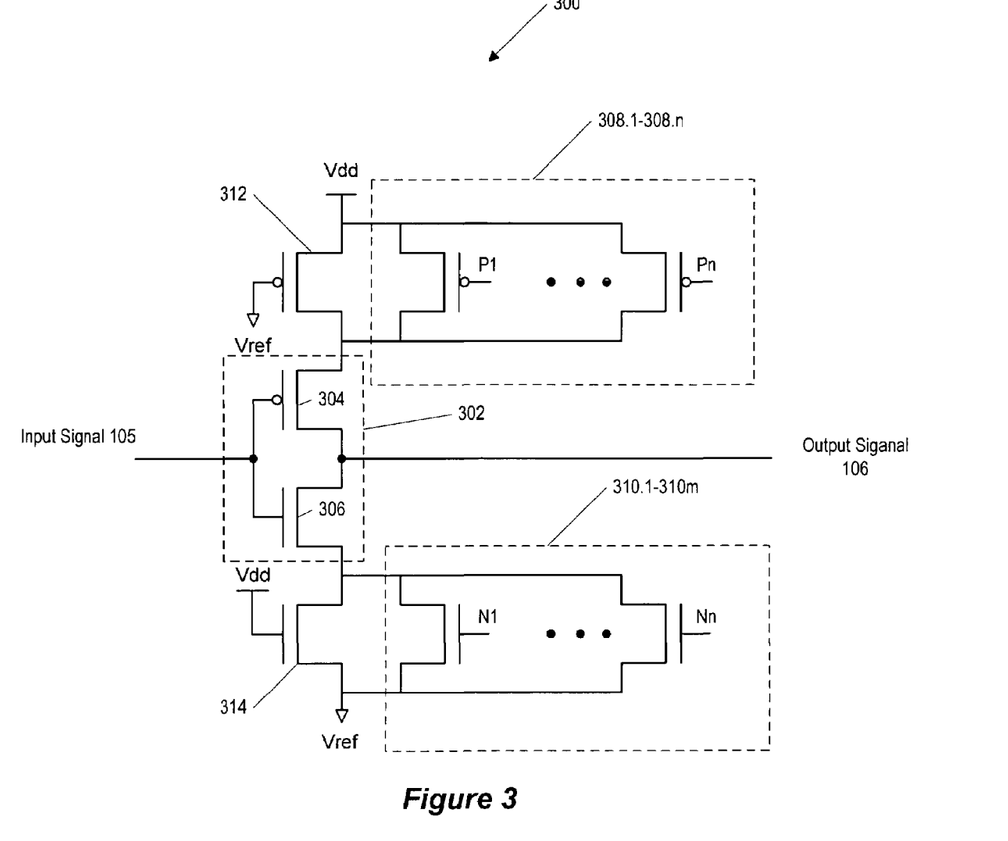
FIG. 3 depicts an on-chip pulse width adjustment circuit with pull-up and pull-down devices configured in series with an on-chip signal driver.

FIG. 3 depicts one embodiment of a signal drive/state duration control stage 300. Signal drive stage 302 includes a pull-up P-channel MOSFET 304 to source current and a pull-down, N-channel MOSFET 306 to sink current. An additional "n" P-channel MOSFETs 308.1 through 308.n are connected in parallel with P-channel MOSFET 312 and connected in series between signal drive stage 302 and supply voltage Vdd. An additional "m" N-channel MOSFETs 310.1 through 310.m are connected in parallel with pull-down, N-channel MOSFET 314 and connected in series between signal drive stage 302 and reference voltage Vref. The values of "n" and "m" are integers and may be the same or different. Transistors 312 and 314 are always "ON" (conducting), and, thus, increase the minimum pulse width of the output signal 106.

Figure 4:
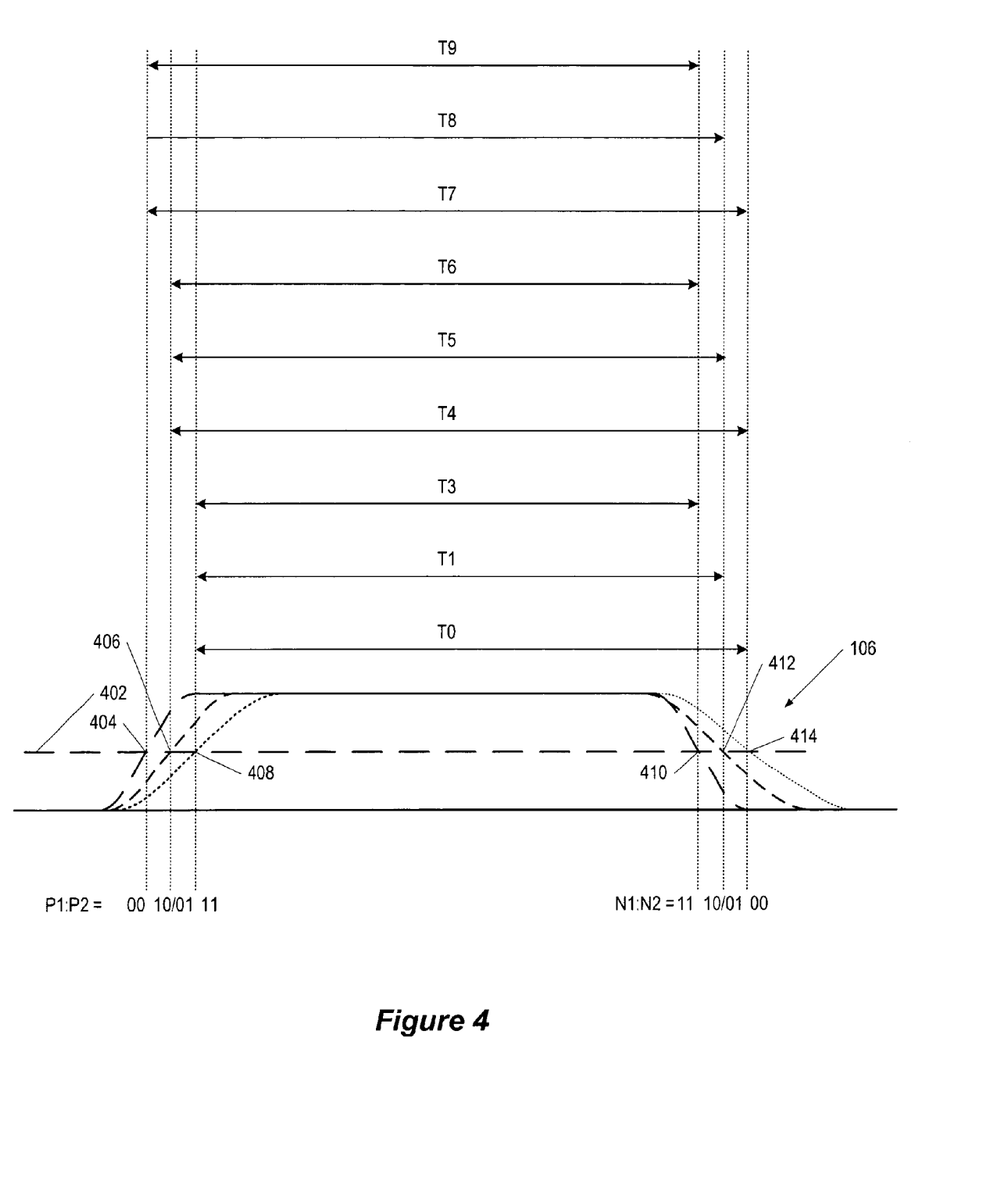
FIG. 4 depicts an on-chip signal with various pulse width adjustments.

The signal state duration control system 112 provides an n bit signal to the conduction control terminal (gate) of P-channel MOSFETs 308.1 through 308.n and/or an m bit signal to the conduction control terminal (gate) of N-channel MOSFETs 310.1 through 310.m. Assuming a state change at the voltage level indicated by reference line 402 and assuming that n=m=2, Table 1 in conjunction with FIG. 4 depicts the various states of gate control signals P2, P1, N1, and N2 and the corresponding rising edge, falling edge, and pulse width. The gate control signals represent one embodiment of signal state adjustment control data 114. It will be apparent that the resolution in pulse widths, i.e. the amount of change between pulse widths, can be increased by increasing "n" and/or "m", and the resolution can be decreased by decreasing "n" and/or "m". Additionally, the degree of change between pulse width values, e.g. the difference between T1 and T2, can be changed by changing the characteristics of transistors 308 and/or 310. The pulse width adjustment resolution and degree of change between adjoining pulse widths is a matter of design choice. FIG. 4 depicts the "high" state of an example output signal 106. The period of output signal 106 is a matter of design of application.

TABLE 1

| Gate Control Signals P2:P1:N2:N1 | Rising Edge | Falling Edge | Pulse Width |
|---|---|---|---|
| 0000 | 404 | 414 | T1 |
| 0001 | 404 | 412 | T2 |
| 0010 | | | |
| 0011 | 404 | 410 | T3 |

TABLE 1-continued

| Gate Control Signals P2:P1:N2:N1 | Rising Edge | Falling Edge | Pulse Width |
|---|---|---|---|
| 0100 | 406 | 414 | T4 |
| 1000 | | | |
| 0101 | 406 | 412 | T5 |
| 0110 | | | |
| 1001 | | | |
| 1010 | | | |
| 0111 | 406 | 410 | T6 |
| 1011 | | | |
| 1100 | 408 | 414 | T7 |
| 1101 | 408 | 412 | T8 |
| 1110 | | | |
| 1111 | 408 | 410 | T9 |

Figure 5:
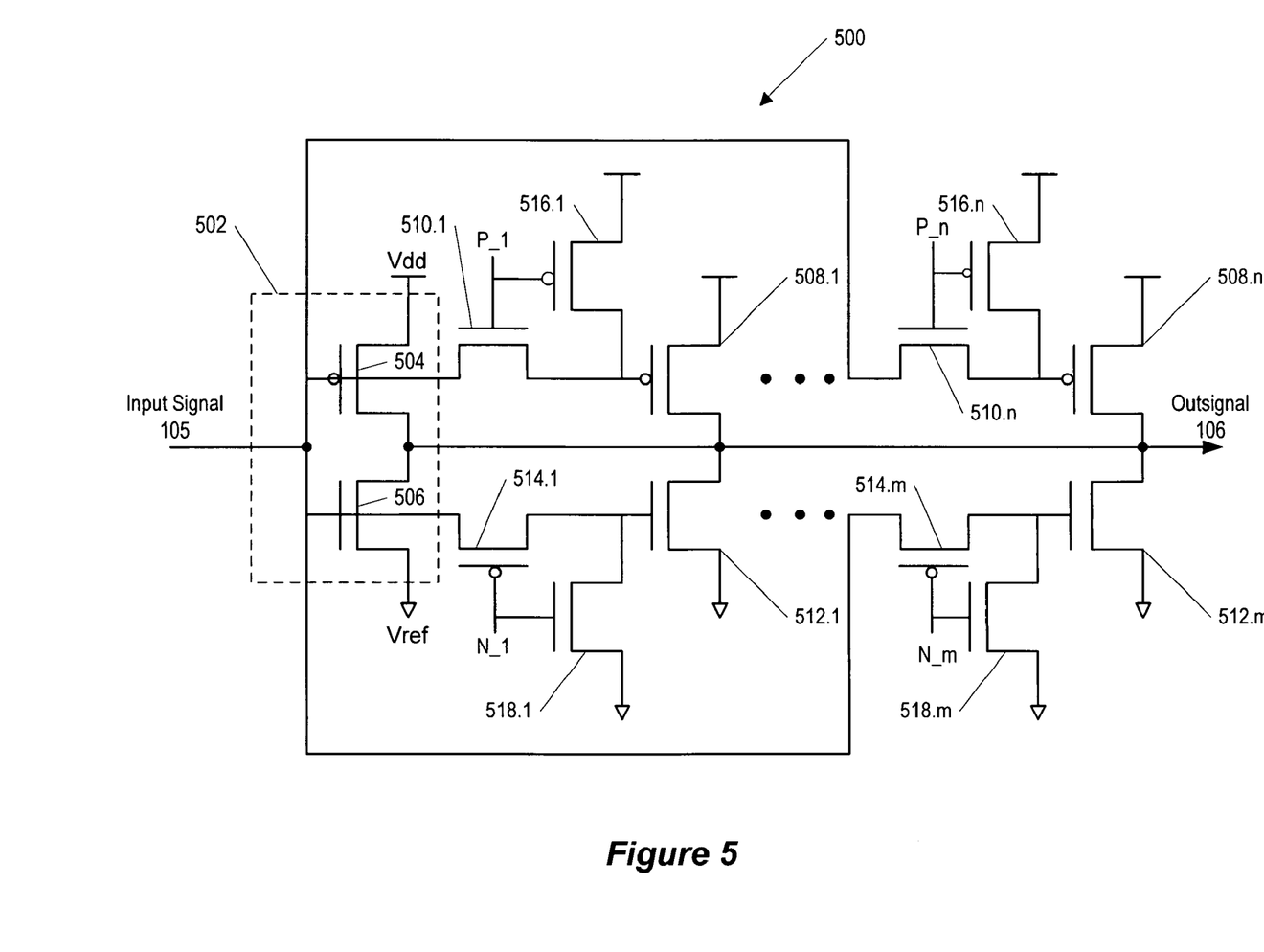
FIG. 5 depicts an on-chip pulse-width adjustment circuit with pull-up and pull-down devices configured in parallel with an on-chip signal driver.

FIG. 5 depicts one embodiment of a signal drive/state duration control stage 500. Signal drive stage 502 includes a P-channel metal oxide semiconductor (PMOS) pull-up transistor 504 to source current from supply voltage Vdd and an N-channel pull-down N-channel MOSFET 506 to sink current to reference voltage Vref. Additional "n" P-channel MOSFETs 508.1 through 508.n are coupled in parallel with signal drive stage 502. N-channel MOSFET switches 510.1 through 510.n allow pull-up transistors 508.1 through 508.n, respectively, to conduct when control signals P1 through Pn are HIGH. To prevent the gates of switches 508.1 thorough 508.n from floating, pull-up P-channel MOSFETs 516.1 through 516.n pull up the gates of pull-up transistors 508.1 through 508.n when the control signals P1 through Pn, respectively, at the gates switches 516.1 through 516.n are low. Additional "m" N-channel MOSFETs 512.1 through 512.m are coupled in parallel with signal drive stage 506. P-channel MOSFET switches 514.1 through 514.m allow pull-down transistors 512.1 through 512.m, respectively, to conduct when control signals N1 through Nn are LOW. To prevent the gates of switches 512.1 thorough 512.m from floating, pull-down N-channel MOSFETs switches 518.1 through 518.m pull down the gates of pull-up transistors 512.1 through 512.m when the control signals N1 through Nm, respectively, at the gates of switches 516.1 through 516.n are high. The values of "n" and "m" are integers and may be the same or different. The values of the control signals will have the opposite effect on signal drive/state duration control stage 500 than for signal drive/state duration control stage 300. For example, if control signal N1 is set high this causes signal drive/state duration control stage 300 to fall faster, but will cause signal drive/state duration control stage 500 to fall slower, and vice-versa if control signal N1 is set low. Also, if control signal P1 is set high, this causes signal drive/state duration control stage 300 to rise slower, but will cause signal drive/state duration control stage 300 to rise faster, and vice-versa if control signal P1 is set low.

Table 1 in conjunction with FIG. 4 also represents the various states of gate control signals P2, P1, N1, and N2 and the corresponding rising edge, falling edge, and pulse width of signal drive/state duration control stage 500. The signal drive/state duration control stage 500 avoids the restricted rising and falling times imposed by the series configuration of pull-up transistors 304 and 312 and pull-down transistors 306 and 314 by disposing all pull-up and pull-down transistors in respective parallel configurations.

The following description describes embodiments of signal state duration measurement system 102 in more detail. Embodiments of signal state duration measurement system 102 allow measurement of signal state durations using on-chip technology, which in many cases can be accomplished relatively quickly and inexpensively. A signal state duration measurement system 102 embodiment, such as signal state duration measurement system 600 (FIG. 6), is able to compare a known propagation time, T1, of a test data signal with the state duration, T2, of a signal under test. In one embodiment, if T2 compares favorably with T1, then the circuit generating the signal under test 'passes.' Otherwise it 'fails,' and a problem has been identified. Furthermore, in one embodiment, T1 can be selectively adjusted (increased or decreased), to more accurately measure T2. In one embodiment, the test data signal is allowed to travel a signal path, having a known signal propagation delay time, while the signal under test maintains a single state. The test data signal at the beginning of the state, e.g. during the rise of the signal under test, is compared to the test data signal captured at the end of the state, e.g. during the fall of the signal under test. If the initial and captured test data signals are the same, e.g., have the same state, then the duration of the state of the signal under test is greater than or equal to the signal propagation delay time. If the initial and captured test data signals are different, e.g., have different states, then the duration of the state of the signal under test is less than the signal propagation delay time. The test data signal propagation time can be adjusted by inserting varying delay elements into the signal path traversed by the test data signal. Thus, the state duration of a signal under test can be measured, with the degree of resolution being definable by a choice of the test data signal propagation path delay period.

Figure 6:
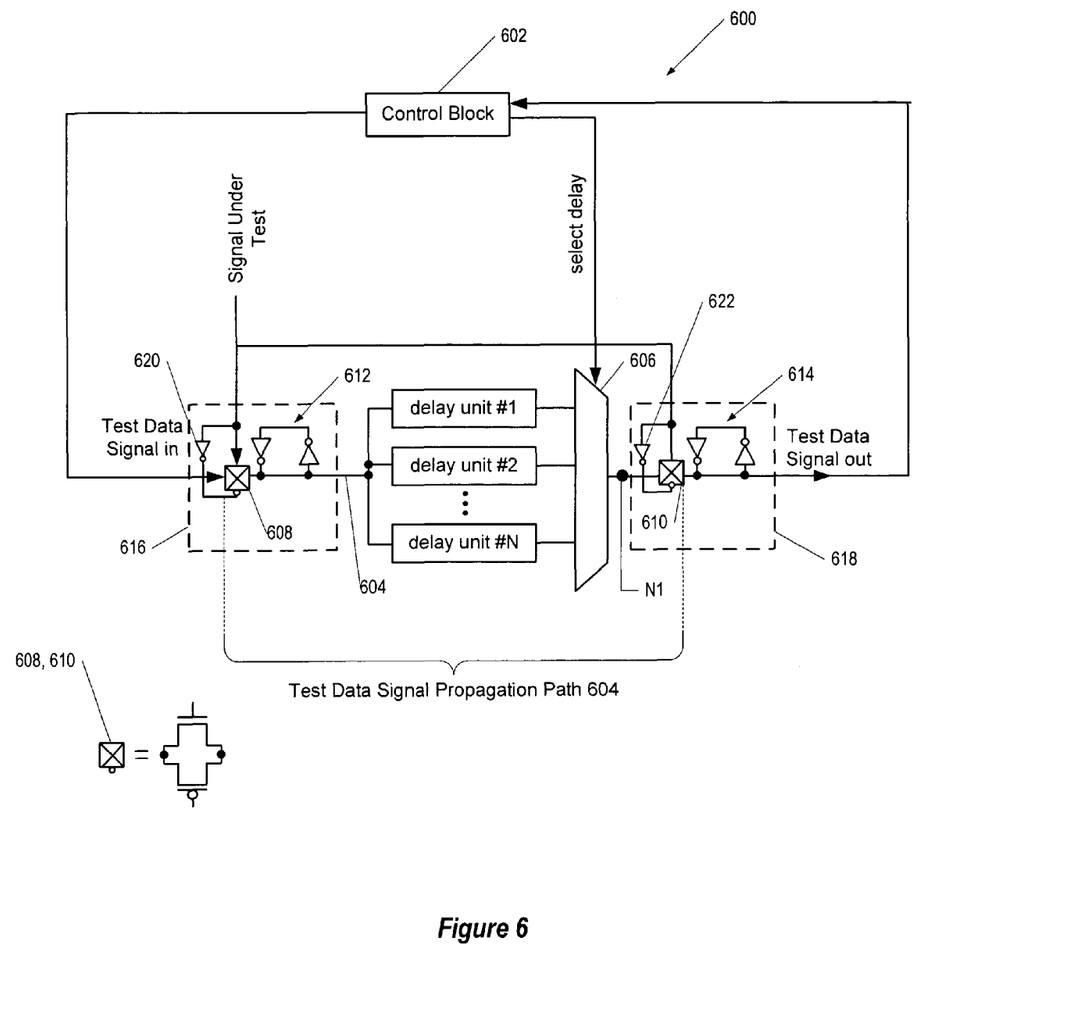
FIG. 6 depicts a signal state duration measurement system.

FIG. 6 depicts signal state duration measurement system 600. In one embodiment, signal state duration measurement system 600 operates in accordance with the signal state duration measurement process 700 shown in FIG. 7. Additionally, signal state duration measurement system 600 can be fabricated entirely on-chip, e.g., as an integrated circuit fabricated on a single semiconductor wafer. In some embodiments, some or all functions of control block 602 delay units, or other components, may exist external to the chip. If so, an externally accessible pin is generally connected to the chip to provide access to data. The signal under test can be any signal of interest, such as self-resetting signals, particularly, but not exclusively, signals that are difficult to externally measure. The signal under test may be selected from multiple signals, all of which could be routed to signal state duration measurement system 600 and tested.

The signal state duration measurement system 600 utilizes the pulse width of the signal under test to begin and end the propagation of a test data signal to an output latch. If the propagation delay time and initial state of a test data signal are known and the pulse width of the signal under test is measured to be greater than or equal to the propagation time of the test data signal, then the state of the test data signal will not change during the period of the signal under test's pulse width. In this case, the duration of the signal under test's pulse width is measured to be greater than or equal to the propagation delay of the test data signal. Likewise, if the pulse width of the signal under test is less than the propagation delay of the test data signal, then the initial test data signal will not match the test data signal captured at the end of the signal under test's pulse width. This is because the state of the test data signal will change at the capture point during the period of the signal under test's pulse width. In this case, the duration of the signal under test's pulse width is measured to be less than the propagation delay of the test data signal. As explained in more detail below, delay elements in the test data signal's propagation path can be varied to adjust the test data signal's propagation time. Thus, in some embodiments, measurement of the pulse width of the signal under test represents a determination of a relationship between a state of the signal under test and a propagation delay time of a test data signal.

The operation of signal state duration measurement system 600 begins with operation 702. In operation 702, control block 602 selects a propagation delay time of the test data signal, T1, by providing a delay select signal to a selection circuit, such as multiplexer 606. The delay select signal selects unit #X along the test data signal propagation path 604, with X being the desired delay unit of the N available delay units.

Figure 12:
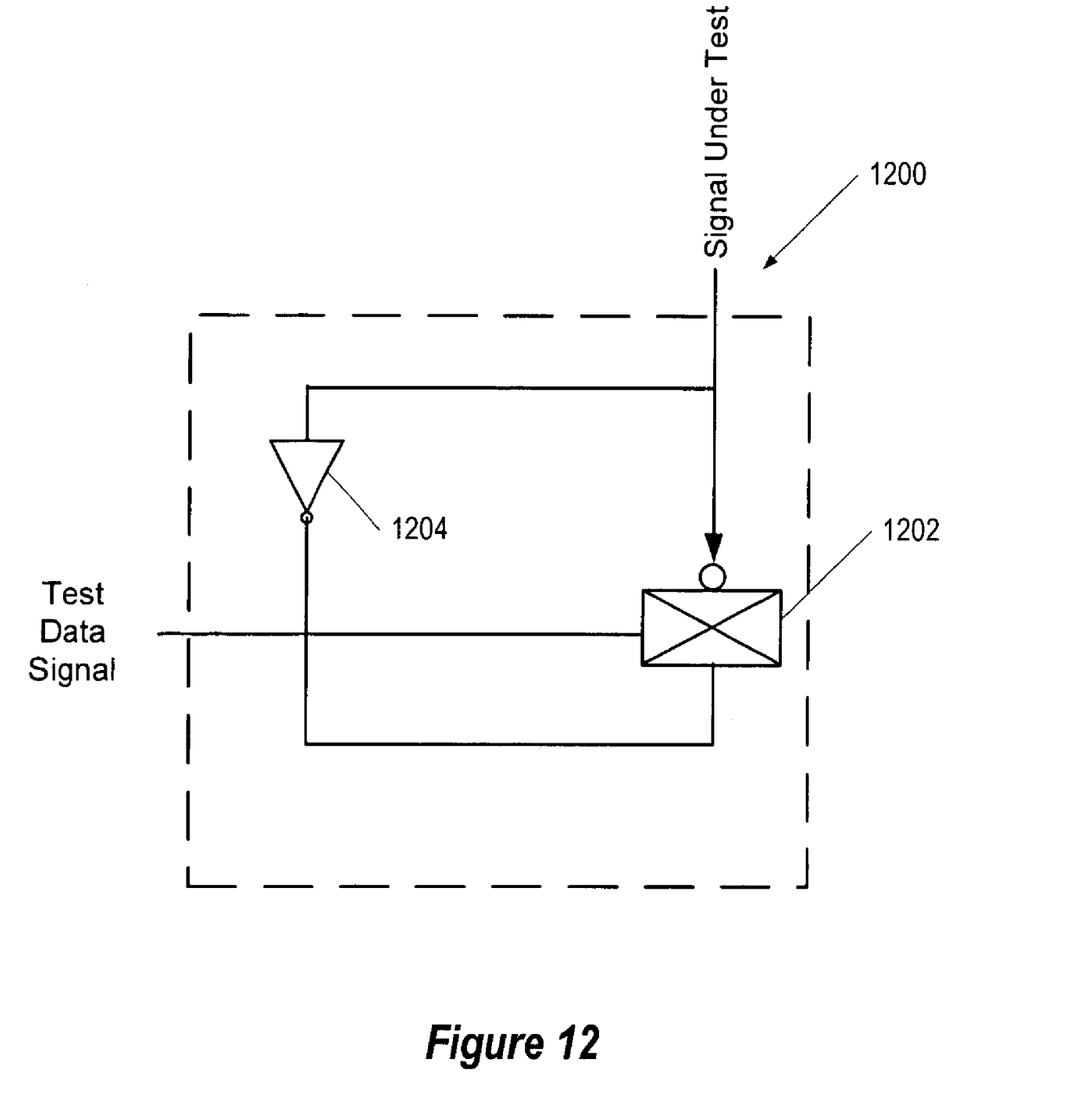
FIG. 12 depicts a gate and latch circuit useful in measuring 'low' state durations of a signal under test.

FIGS. 6 and 12 depict specific components of signal state duration measurement system 600. It will be apparent to those of ordinary skill in the art that other components can be used to create signal state duration measurement system 600. In one embodiment, switches 608 and 610 are parallel N-channel and P-channel metal oxide semiconductor field effect transistors (MOSFETs). Inverters 620 and 622 bias the gates of the PMOS devices of switches 608 and 610, respectively. Latches 612 and 614 are, in one embodiment, cross-coupled inverters. Control block 602 can be virtually any circuit that includes the capability of providing the delay select signal, either in response to, for example, a user command or in response to predetermined programming. Switches 608 and 610, also referred to as transmission gates, are implemented in one embodiment by parallel coupled NMOS and PMOS transistors as shown.

Delay units can be configured in many ways and be made from a variety of different circuit elements, materials, and/or fabrication processes. In one embodiment, delay units 1:N (i.e. 1 through N) are circuits of a known delay that are substantially insensitive to process, voltage, and temperature (PVT) variations. Such circuits include inverters having substantially the same crystal orientations with channel widths and lengths that are large enough to be effectively insensitive to PVT variations. Generally, multiple transistors in parallel are less susceptible to PVT variations. Using longer channel transistors also makes circuits less susceptible to PVT variations. Transresistance devices could also be used as delay units. If transresistance devices are used, a resistance control signal from control block 602 may be used to select the resistance. If selection of particular transresistance devices is unnecessary during the selection of test data signal propagation path 604 delay time, multiplexer 606 can be eliminated. Groups of parallel delay units could also be fabricated in series with each other with multiple parallel and series paths to create many possible data signal propagation path 604 configurations. Providing variability of the data signal propagation path 604 delay allows for design flexibility in the measurement range and resolution of the state duration of the signal under test.

The number and delay value of the delay units can be configured according to the desired accuracy of measurements. For example, if the pulse width of the signal under test is anticipated to be 500 picoseconds plus or minus 250 picoseconds (corresponding to a 1 GHz signal with a 50% duty cycle) then 10 delay units (N=10) can be configured to provide delays in steps of 50 picoseconds. Similarly, if further measurement range and resolution is desired then 100 delay units (N=100) can be configured to provide delays in steps of 5 picoseconds, and so on. In one embodiment, the median propagation delay time is chosen to be the average pulse width of the signal(s) under test with an equal number of delay steps on either side of the median. The number and the value of the delay units can be determined based on several factors for example, the desired accuracy of the measurement, cost of delay units compared to the overall cost of the integrated circuit, design area available within the integrated circuit, complexity of routing and placement of other critical paths within the integrated circuits or the like. The total signal propagation time of data signal propagation path 604 also depends on the conductance delay of switches 608 and 610 after receiving a control signal, an inherent path delay of data signal propagation path 604 (e.g., transmission line impedance), and the like. Thus, in one embodiment, the total propagation delay of data signal propagation path 604 equals the sum of all signal propagation delay factors along data signal propagation path 604. It will be apparent to those of ordinary skill in the art that there are virtually limitless ways to construct and implement delay choices for signal state duration measurement system 600.

In operation 703, control block 602 places the data signal propagation path 604 into a known state different than the initial state of the test data signal by, for example, causing signal state duration measurement system 600 to propagate an inverted version of test data signal to be used by signal duration measurement process 700. In operation 704, the test data signal is received at the source of switch 608 while switch 608 is nonconductive. Thus, when switch 608 becomes conductive, the state of the test data signal will be known. In one embodiment of signal state duration measurement system 600, the state of the test data signal is 'high'. In another embodiment described below in conjunction with FIG. 12, gate and latch circuit 1200 is used to allow testing of the 'low' pulse of the signal under test.

Figure 7:
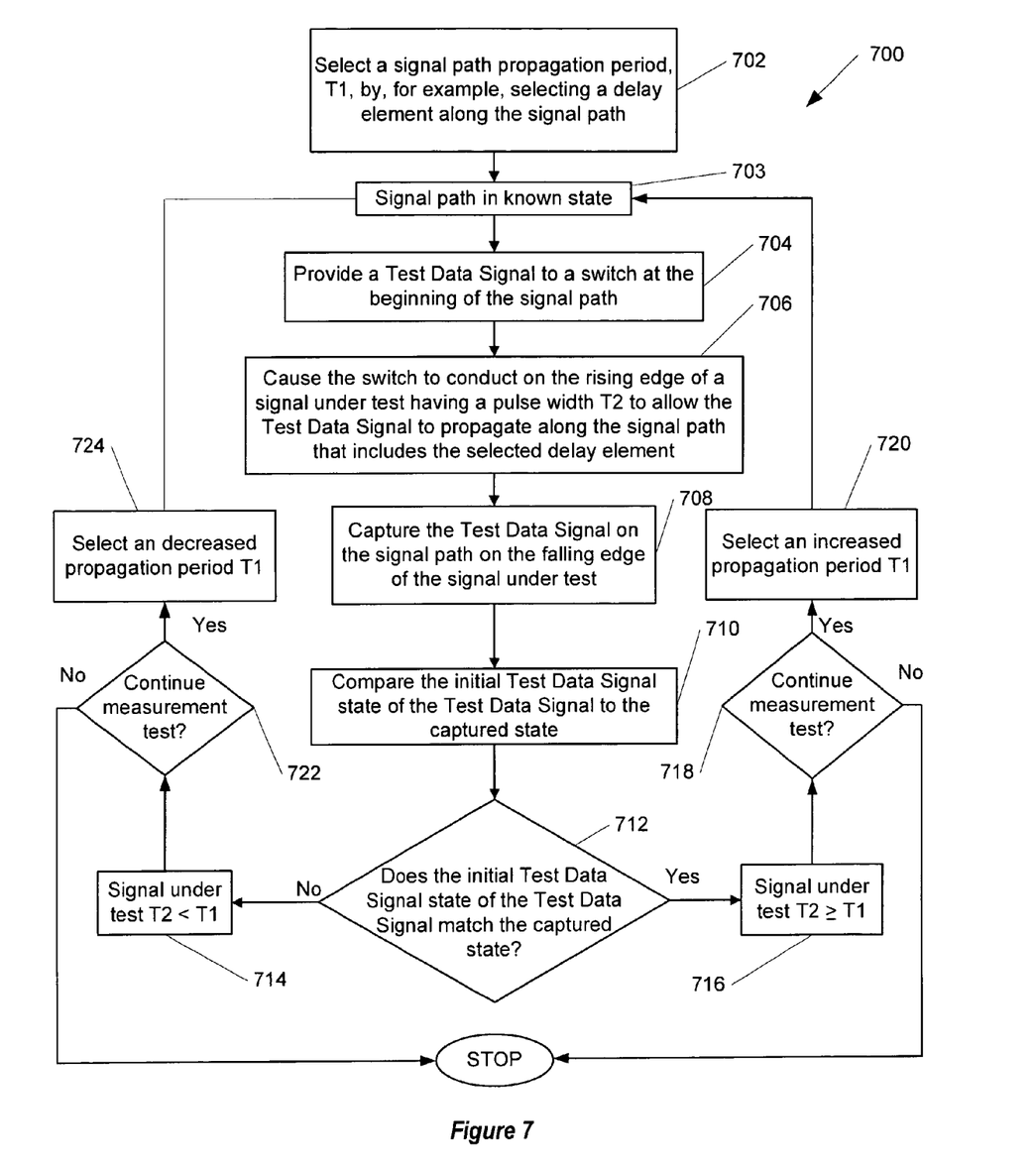
FIG. 7 depicts a signal state duration measurement process for use with the signal state duration measurement system of FIG. 6.
Figure 8:
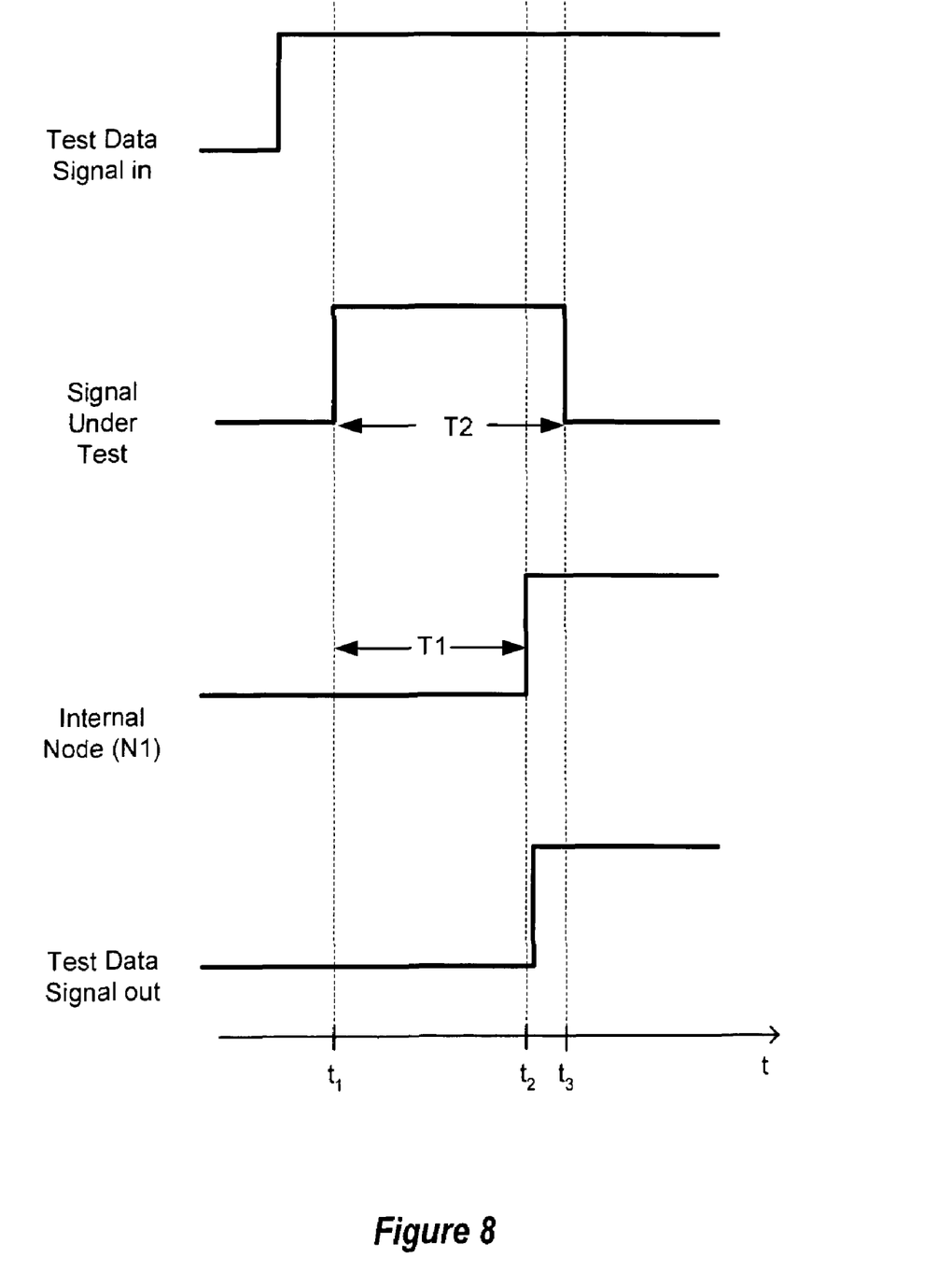
FIGS. 8 and 9 depict examples of various test data signal and signal under test waveforms that may be generated by the signal duration measurement system during the signal duration measurement process of FIG. 7.
Figure 9:
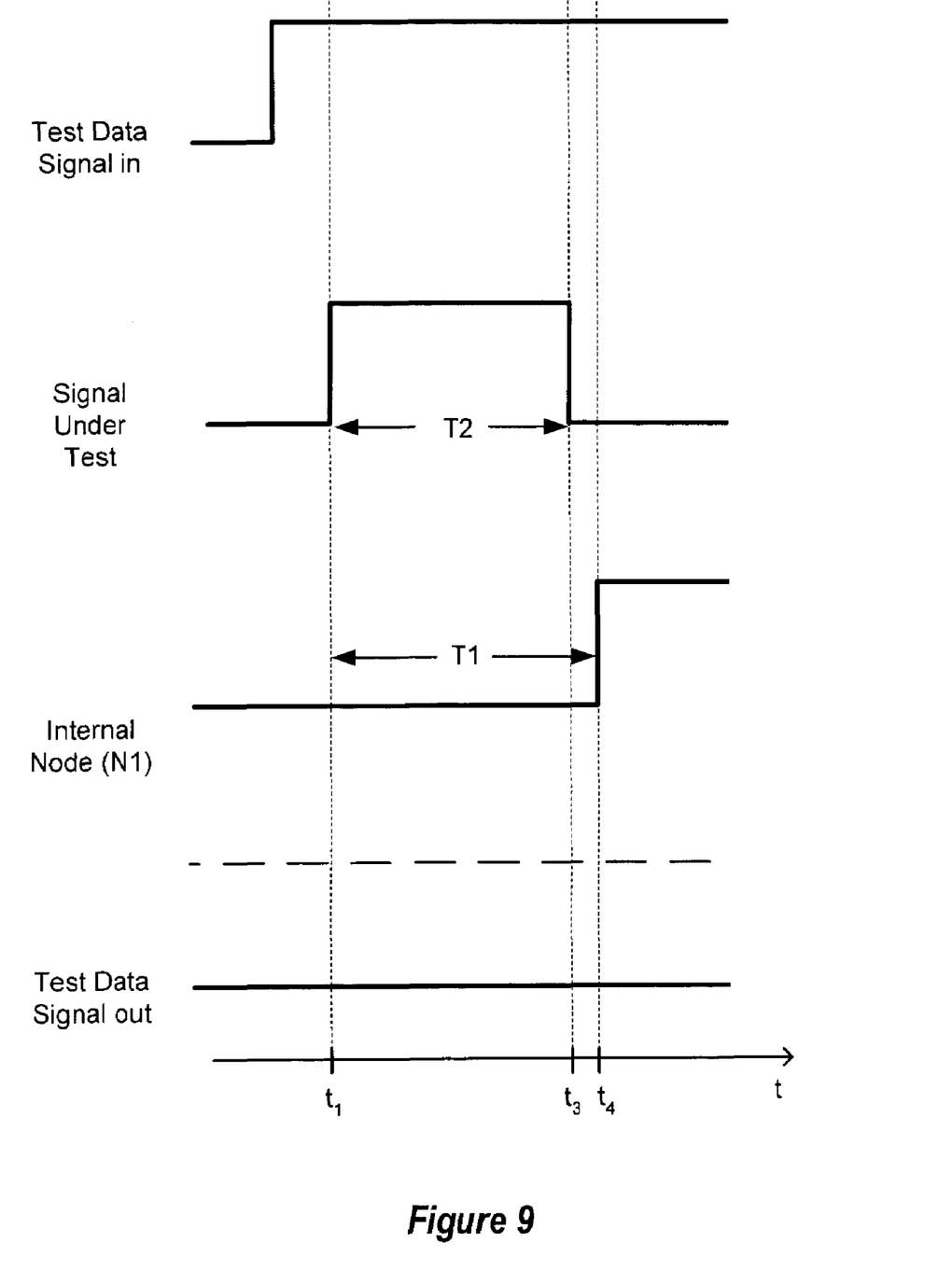

FIGS. 8 and 9 depict example test data signal and signal under test waveforms, discussed in conjunction with signal state duration measurement system 600 and process 700. Referring to FIG. 8, once the test data signal is in a known state at switch 608, in operation 706 (at time t1 (FIG. 8)) the signal under test is applied to the control terminal of switches 608 and 610 to cause them to conduct. Logic in control block 602 could be used to time the arrival of the signal under test to switches 608 and 610. From time t1 to time t2, the test data signal then propagates along data signal propagation path 604 through latch 612, through the delay unit selected by control block 602, and through multiplexer 606 to node N1. Note: in some embodiments node N1 is used to illustrate the state of the test data signal just prior to being captured by latch 614 and is not a physically separate component of the test data signal propagation path 604. In operation 708, at time t3, the signal under test transitions from 'high' to 'low' thereby causing switch 610 to become nonconductive. The test data signal is captured at time t3 by latch 614, which saves the state of the test data signal as of time t3 when switch 610 becomes nonconductive.

In operation 710, control block 602 compares the initial state of the test data signal "in" at time t1 with the state of the test data signal "out" at time t3, the time of test data signal capture. At time t1, the initial state of the test data signal is 'high,' and at time t3, the captured state of the test data signal is 'high'. Thus, as determined in operation 712 by control block 602, the initial state of the test data signal matches the captured state of the test data signal.

The signal duration measurement process 700 then proceeds to operation 716, which provides an indication that the pulse width T2 of the signal under test is greater than or equal to T1 (i.e. t2-t1). The indication could be provided, for example, to an off-chip analyzer or to control block 602, which could proceed according to a predetermined program. In operation 718, if a delay unit having a longer delay is not available and/or continuing the measurement test is not desired, operation 718 stops signal duration measurement process 700. If a delay unit having a longer delay is available and continuing the measurement test is desired, control block 602 provides a selection signal to multiplexer 606 to select a delay unit that will increase the signal propagation time of data signal propagation path 604. The signal duration measurement process 700 then returns to operation 703 and proceeds as described above. An example condition of when it would be desirable to continue measurement testing would be when increased resolution is desired and possible (e.g. a longer delay not previously used is available for selection), and it is desirable that T2 be greater than equal to T1. If it is desirable that the pulse width T2 of the signal under test is greater than or equal to T1, then the signal under test could be designated as "passes". If it is undesirable that the pulse width T2 of the signal under test is greater than or equal to T1, then the signal under test could be designated as "fails".

Referring to FIG. 9, assuming completion of operations 720 and 703, at t1 operation 706 causes switches 608 and 610 to conduct, and a "high" state test data signal propagates along data signal propagation path 604. In the example of FIG. 9, because a longer delay has already been selected in operation 720, the propagation delay time T1 of the test data signal is increased to t4-t1. At t3, the signal under test undergoes a state transition to 'low', switch 610 becomes nonconductive, and latch 614 captures the 'low' state of the test data signal out at t3. The state of internal node N1 does not change until t4, after switch 610 becomes nonconductive. In operations 710 and 712, a comparison of the initial and captured states of the test data signal determines that the states of test data signal in and test data signal out do not match. Thus, the pulse width of the signal under test T2 is less than T1. The indication that T2 is less than T1 in operation 714 could be provided, for example, to an off-chip analyzer or to control block 602. If a delay unit having a shorter delay but longer than any previously selected delay (thus, increased resolution is not available) is not available and/or continuing the measurement test is not desired, operation 722 stops signal duration measurement process 700.

If operation 722 determines that a delay unit having such shorter delay is available and continuing the measurement test is desired, then control block 602, in operation 724, provides a selection signal to multiplexer 606 to select a delay unit that will decrease the signal propagation period of data signal propagation path 604. The signal duration measurement process 700 then returns to operation 703 and proceeds as described above except that operation 718 would determine whether or not a previously unselected longer delay unit is available. An example condition of when it would be desirable to continue measurement testing would be when increased resolution is desired and possible and it is desirable that T2 be greater than equal to T1. If it is desirable that the pulse width T2 of the signal under test is less than T1, then the signal under test could be designated as "passes". If it is undesirable that the pulse width T2 of the signal under test is less than T1, then the signal under test could be designated as "fails".

Figure 10:
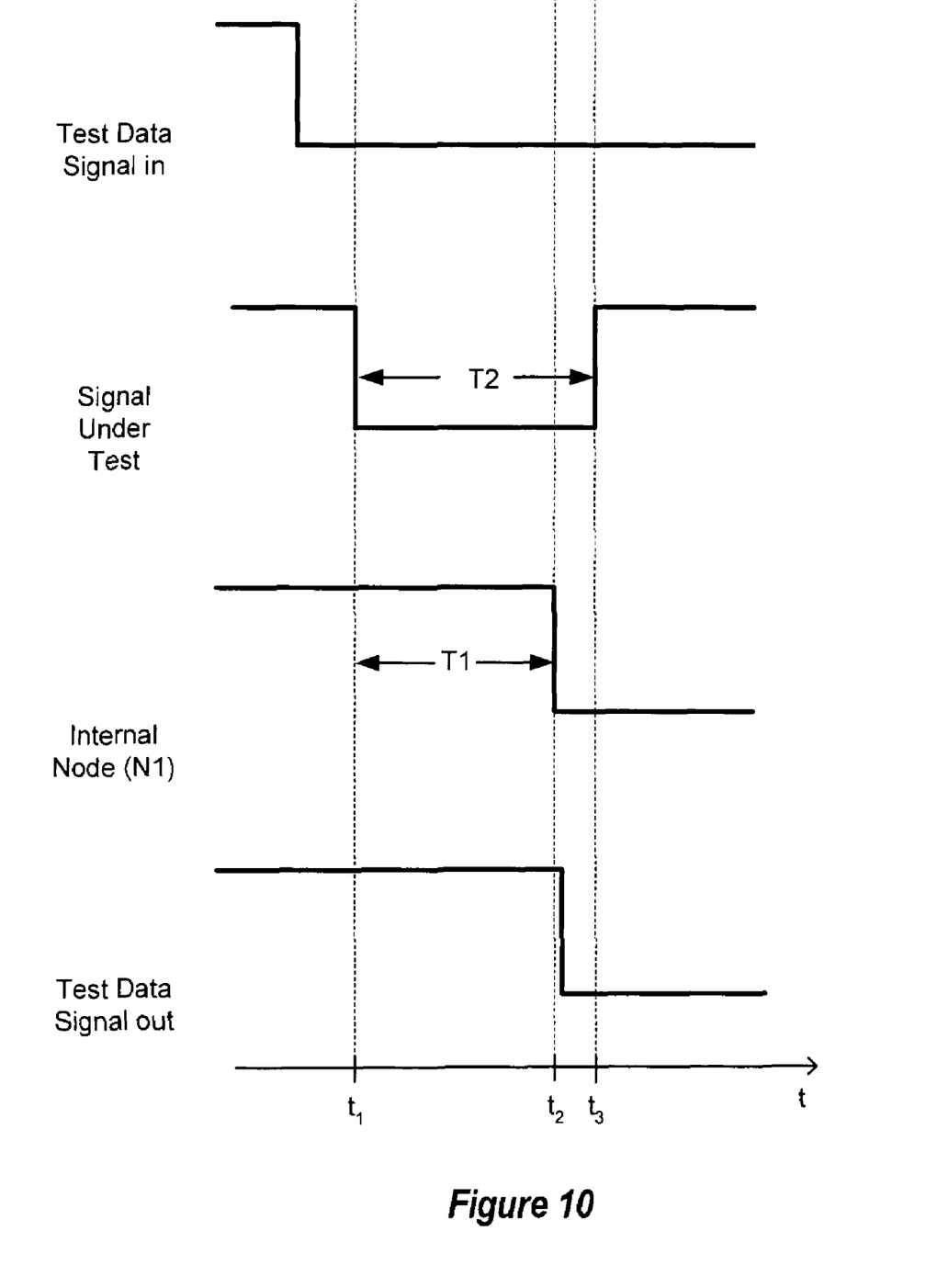
FIGS. 10 and 11 depict examples of various test data signal and signal under test waveforms that may be generated by the signal duration measurement system of FIG. 6 as modified by the gate and latch circuit of FIG. 12.
Figure 11:
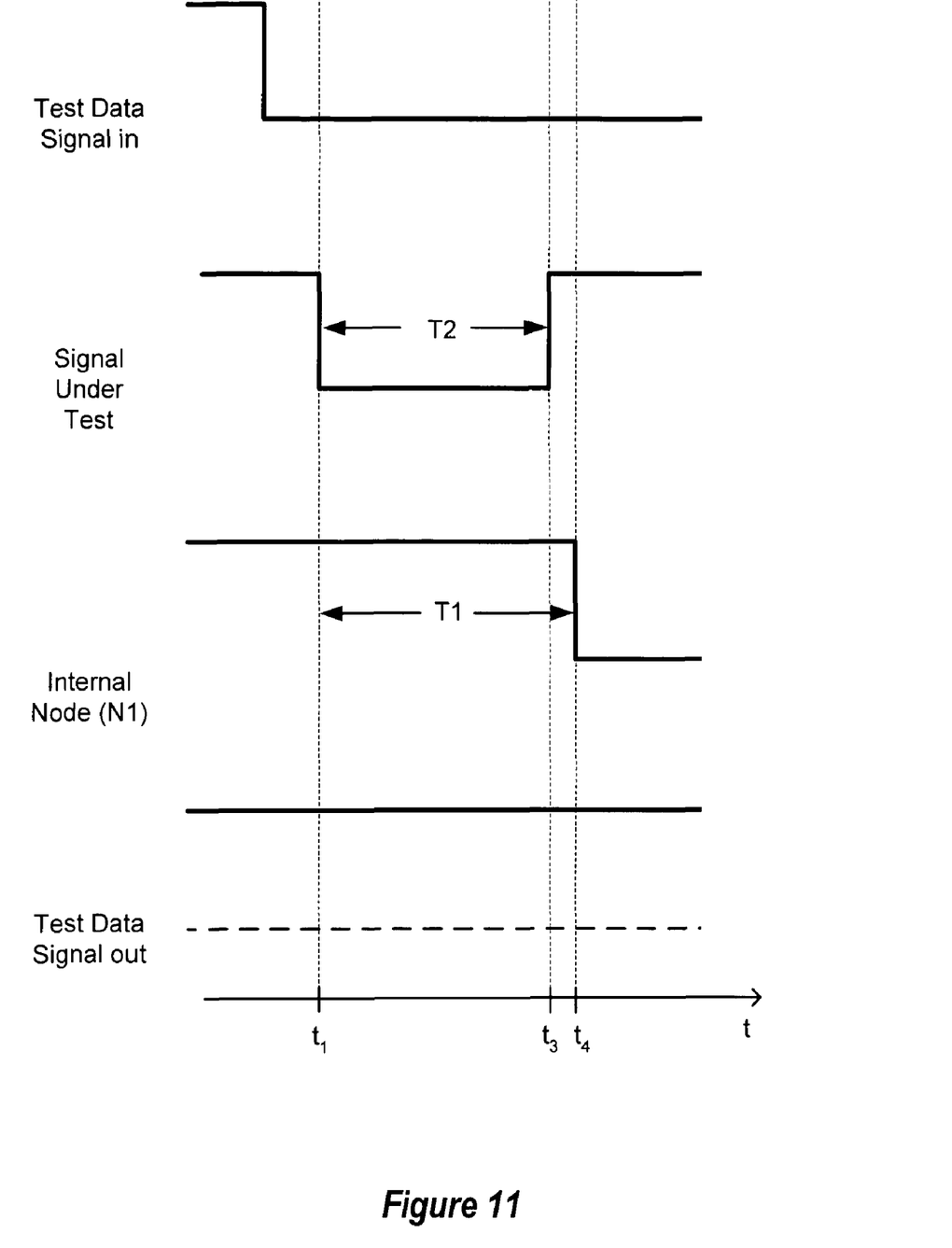

FIGS. 10 and 11 demonstrate that the signal state duration measurement system 600 can also effectively measure the 'low' state duration of the signal under test when gate and latch circuits 616 and 618 are each replaced by gate and latch circuit 1200. Gate and latch circuit 1200 uses the control terminal of a P-channel MOSFET of transmission gate 1202 to receive the signal under test and an inverter 1204 to bias the gate of an N-channel MOSFET of transmission gate 1202. Transmission gate 1202 can be implemented in the same manner as switches 608 and 610. Signal duration measurement process 700 operates as discussed above. In FIG. 10, the initial state of the test data signal, determined at t1, is 'low' and the captured state, determined at t3, is 'low'. Thus, the initial and captured states of the test data signal match because the 'low' state duration, T2, of the signal under test is greater than T1. In FIG. 11, increasing the propagation delay time of data signal propagation path 604 to t4-t1, by selecting a delay unit with a longer delay, prevents test data signal 'in' from reaching switch 1202 within the time T2. Thus, the initial and captured states of the test data signal do not match, and the duration T2 is less than or equal to T1. Signal duration measurement process 700 would continue to operate as discussed above.

Thus, signal state duration measurement system 102 and signal state duration control system 112 provide an efficient combination to detect and correct signal state duration errors. Although two embodiments of adjustable signal state duration control stages, i.e. signal drive/state duration control stage 300 and 500, have been disclosed, it will be understood by those of ordinary skill in the art that many mechanisms and technologies can be used to receive adjust control commands and respond by adjusting the signal state duration of an output signal.

Although the present invention has been described in detail, it should be understood that various changes, substitutions and alterations can be made hereto without departing from the spirit and scope of the invention as defined by the appended claims. For example, more complicated test data signal patterns, such as multiple cycles of the test data signal, could be used provided that the initial and captured states can be related in time. Additionally, operation 716 could reflect T2 is greater than T1, and operation 714 could reflect T2 is less than or equal to T1.

What is claimed is:

1. A method of adjusting a signal state duration of an on-chip signal using one or more on-chip systems, the method comprising:
   (a) determining the signal state duration of the on-chip signal within a range of accuracy using on-chip circuitry;
   (b) comparing the signal state duration of the on-chip signal to a known propagation time of a test data signal using a first on-chip system; and
   (c) if the determined signal state duration of the on-chip signal does not have a desired value, adjusting the signal state duration towards the desired value using a second on-chip system.

2. The method of claim 1 wherein the signal state duration of the on-chip signal is the pulse-width of the on-chip signal.

3. The method of claim 1 wherein adjusting the pulse-width of the signal towards the desired value comprises adjusting a rising edge time delay of each of one or more driver stages of the signal.

4. The method of claim 1 wherein adjusting the pulse-width of the signal towards the desired value comprises adjusting a falling edge time delay of each of one or more driver stages of the signal.

5. The method of claim 1 wherein adjusting the pulse-width of the signal towards the desired value comprises adjusting a P/N strength of one or more driver stages of the signal.

6. The method of claim 5 wherein each of the one or more driver stages comprises a first pull-up driver circuit and adjusting the P/N strength of one or more driver stages of the signal comprises:

adjusting a turn-on delay time of one or more of the first pull-up driver circuits using one or more additional pull-up driver circuits coupled in series with one or more of the first pull-up driver circuits.

7. The method of claim 5 wherein each of the one or more driver stages comprises a first pull-down driver circuit and adjusting the P/N strength of one or more driver stages of the signal comprises:
adjusting a turn-on delay time of one or more of the first pull-down driver circuits using one or more additional pull-down driver circuits coupled in series with one or more of the first pull-down driver circuits.

8. The method of claim 5 wherein each of the one or more driver stages comprises a first pull-down driver circuit and a first pull-down driver circuit and adjusting the P/N strength of one or more driver stages of the signal comprises:
adjusting a turn-on delay time of one or more of the first pull-down driver circuits using one or more additional pull-down driver circuits coupled in series with one or more of the first pull-down driver circuits; and
adjusting a turn-on delay time of one or more of the first pull-up driver circuits using one or more additional pull-up driver circuits coupled in series with one or more of the first pull-up driver circuits.

9. The method of claim 5 wherein each of the one or more driver stages comprises a first pull-up driver circuit and adjusting the P/N strength of one or more driver stages of the signal comprises:
adjusting a turn-on delay time of one or more of the first pull-up driver circuits using one or more additional pull-up driver circuits coupled in parallel with one or more of the first pull-up driver circuits.

10. The method of claim 5 wherein each of the one or more driver stages comprises a first pull-down driver circuit and adjusting the P/N strength of one or more driver stages of the signal comprises:
adjusting a turn-on delay time of one or more of the first pull-down driver circuits using one or more additional pull-down driver circuits coupled in parallel with one or more of the first pull-down driver circuits.

11. The method of claim 5 wherein each of the one or more driver stages comprises a first pull-down driver circuit and a first pull-down driver circuit and adjusting the P/N strength of one or more driver stages of the signal comprises:
adjusting a turn-on delay time of one or more of the first pull-down driver circuits using one or more additional pull-down driver circuits coupled in parallel with one or more of the first pull-down driver circuits; and
adjusting a turn-on delay time of one or more of the first pull-up driver circuits using one or more additional pull-up driver circuits coupled in parallel with one or more of the first pull-up driver circuits.

12. The method of claim 1 wherein determining the signal state duration of the on-chip signal within a range of accuracy using on-chip circuitry comprises:
receiving a data signal using on-chip circuitry at time t1, wherein time t1 is determined by the on-chip signal;
maintaining a state of the data signal for a period T1;
capturing the data signal using the on-chip circuitry at time t2, wherein time t2 is also determined by the on-chip signal; and
comparing a state of the captured data signal with the state of the received data signal to determine a relationship between period T1 and period T2, wherein period T2 equals t2 minus t1.

13. An integrated circuit comprising circuitry operable to perform the method of claim 1.

14. An apparatus having one or more on-chip systems to determine and adjust a signal state duration of one or more on-chip signals, the apparatus comprising:
an on-chip signal state duration measuring system having an input to receive an on-chip signal and determine the signal state duration of the on-chip signal within a range of accuracy by comparing the signal state duration of the on-chip signal to a known propagation time of a test data signal; and
an on-chip signal state duration control system coupled to the signal state duration measuring system to receive the determined signal state duration of the on-chip signal and, if the signal state duration of the on-chip signal is not within a predetermined tolerance, to adjust the signal state duration of the on-chip signal to a desired value.

15. The apparatus of claim 14 wherein the signal state duration of the on-chip signal is the pulse-width of the on-chip signal.

16. The apparatus of claim 14 wherein the on-chip signal state duration control system further comprises a comparison circuit to compare the determined signal state duration of the on-chip signal with a desired value.

17. The apparatus of claim 14 further comprising:
a signal state duration adjustment circuit coupled to the on-chip signal state duration control system.

18. The apparatus of claim 17 wherein the signal state duration adjustment circuit comprises:
one or more driver stages to drive and adjust the signal state duration of the on-chip signal in accordance with data received from the on-chip signal state duration control system.

19. The apparatus of claim 18 wherein each of the driver stages comprise:
a first pull-up driver circuit; and
one or more additional pull-up driver circuits coupled in series with the first pull-up driver circuit.

20. The apparatus of claim 18 wherein each of the driver stages comprise:
a first pull-up driver circuit; and
one or more additional pull-up driver circuits coupled in parallel with the first pull-up driver circuit.

21. The apparatus of claim 18 wherein each of the driver stages comprise:
a first pull-down driver circuit; and
one or more additional pull-down driver circuits coupled in parallel with the first pull-down driver circuit.

22. The apparatus of claim 18 wherein each of the driver stages comprise:
a first pull-down driver circuit; and
one or more additional pull-down driver circuits coupled in parallel with the first pull-down driver circuit.

23. The apparatus of claim 18 wherein:
at least one of the driver stages comprises:
a first pull-up driver circuit; and
one or more additional pull-up driver circuits coupled in parallel with the first pull-up driver circuit; and
at least one of the driver stages comprises:
a first pull-down driver circuit; and
one or more additional pull-up driver circuits coupled in parallel with the first pull-down driver circuit.

24. The apparatus of claim 18 wherein:
at least one of the driver stages comprises:
a first pull-up driver circuit; and
one or more additional pull-up driver circuits coupled in series with the first pull-up driver circuit; and at least one of the driver stages comprises:
  a first pull-down driver circuit; and
  one or more additional pull-down driver circuits coupled in series with the first pull-down driver circuit.

25. The apparatus of claim 14 wherein the on-chip signal state duration measuring system further comprises:
  a first on-chip switch having an input node to receive a data signal at time t1 and a conductivity control node to receive the on-chip signal;
  an on-chip delay circuit having an input node coupled to an output node of the first switch and having a selection node coupled to delay control circuitry;
  an on-chip second switch having an input node coupled to an output node of the delay circuit and a conductivity control node to receive the on-chip signal;
  an on-chip data signal capture circuit coupled to an output node of the second switch to capture the data signal at time t2; and
  a comparison circuit coupled to the first switch and coupled to the data signal capture circuit to compare (a) the data signal received by the first on-chip switch when the on-chip signal at time t3 causes the first switch to conduct the data signal to (b) the data signal captured by the data signal capture circuit when the on-chip signal subsequently at time t4 causes the second switch to become nonconductive.

26. An integrated circuit having a system to adjust a signal state duration of an on-chip signal using one or more on-chip systems, the integrated circuit comprising:
  on-chip means to determine the signal state duration of the on-chip signal within a range of accuracy;
  means, coupled to the means to determine, to compare the signal state duration of the on-chip signal to a known propagation time of a test data signal using a first on-chip system; and
  means to adjust the signal state duration towards the desired value using a second on-chip system if the determined signal state duration of the on-chip signal does not have a desired value.

27. The method of claim 26 wherein the signal state duration of the on-chip signal is the pulse-width of the on-chip signal.

* * * * *